United States Patent [19]

Heinrich et al.

[11] 4,151,478
[45] Apr. 24, 1979

[54] NONLINEARLY VARIABLE GAIN APPARATUS

[75] Inventors: Eric C. Heinrich, Seminole; William H. Mosley, Jr., St. Petersburg, both of Fla.

[73] Assignee: The United States of America as represented by the Secretary of the Air Force, Washington, D.C.

[21] Appl. No.: 866,433

[22] Filed: Jan. 3, 1978

[51] Int. Cl.² .............................................. H03F 1/36
[52] U.S. Cl. .................................... 330/108; 330/69; 330/103
[58] Field of Search ................. 328/145; 330/69, 103, 330/108, 260, 282

[56] References Cited

U.S. PATENT DOCUMENTS

| 3,448,289 | 6/1969 | Harris | 328/145 X |
| 3,506,847 | 4/1970 | Schow  | 328/145 X |

Primary Examiner—Lawrence J. Dahl
Attorney, Agent, or Firm—Joseph E. Rusz; George Fine

[57] ABSTRACT

A nonlinearly variable gain circuit is utilized to produce an inverted logarithmic S curve of gain versus potentiometer rotation while using a linear resistance taper potentiometer. An operational amplifier feedback circuit uses the linear potentiometer and a resistance network in combination.

1 Claim, 1 Drawing Figure

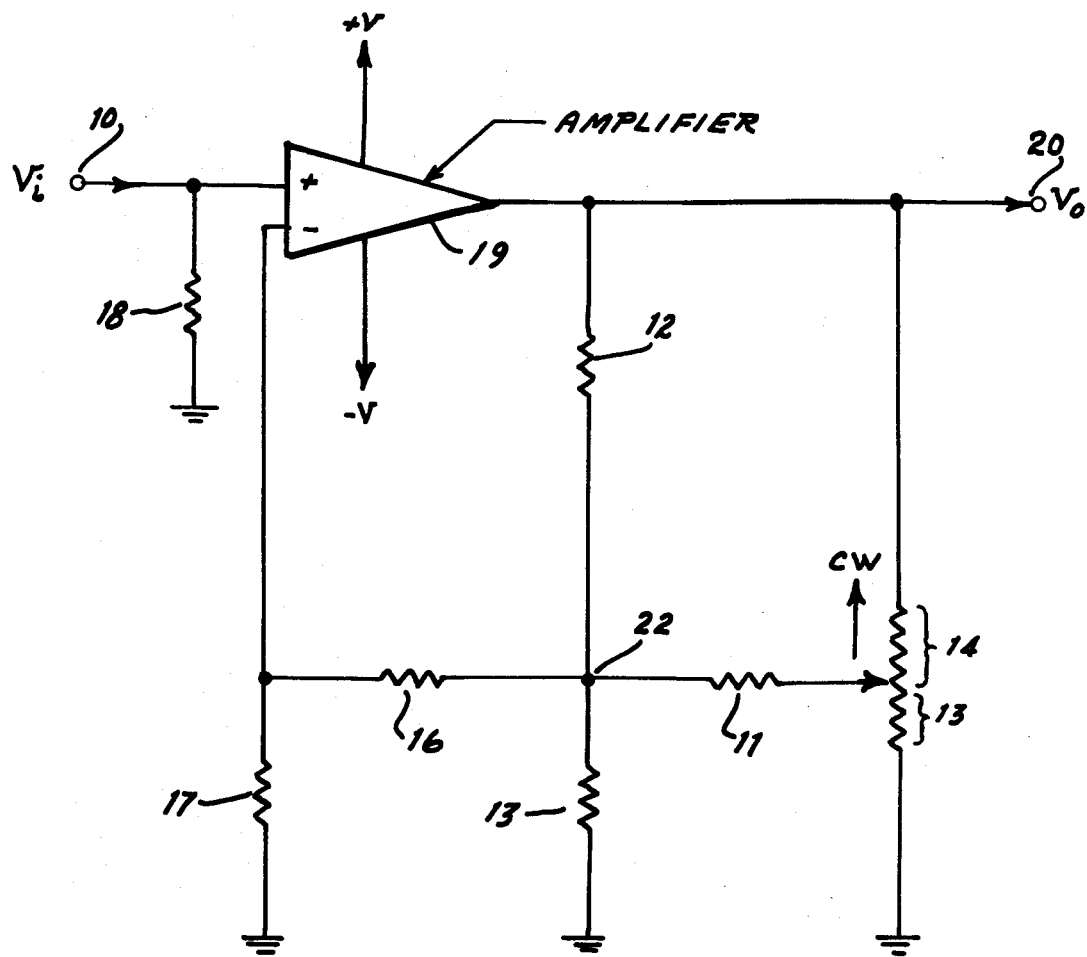

NONLINEARLY VARIABLE GAIN APPARATUS

STATEMENT OF GOVERNMENT INTEREST

The invention described herein may be manufactured and used by or for the Government for governmental purposes without the payment of any royalty thereon.

BACKGROUND OF THE INVENTION

There are many uses for an apparatus which can produce an inverted logarithmic S curve of gain versus potentiometer rotation while using a linear resistance taper potentiometer. Prior art did not produce this curve and used only passive components such as T-pads with special taper characteristics. Disadvantages of the prior art include cost of special taper components, amplitude loss rather than gain, and strict termination impedance requirements. Advantages of the invention over the prior art include active gain, selectable impedance for input and output without affecting performance and most importantly, the use of a standard linear taper potentiometer.

SUMMARY OF THE INVENTION

A nonlinearly variable gain apparatus is provided. An operational feedback circuit uses a linear potentiometer and a resistance network to produce an inverted logarithmic S curve of gain versus potentiometer rotation. The circuit is useful where a very accurate gain setting is required above a normal point but greater variation is required away from this point.

BRIEF DESCRIPTION OF THE DRAWING

A single FIGURE shows partly in block and partly in schematic form the preferred embodiment.

DETAILED DESCRIPTION OF THE INVENTION

Now referring in detail to the preferred embodiment, three is shown equation 1 which is:

$$\frac{V_o}{V_i} = \left[\frac{R6 + R7}{R7}\right] \frac{\left[1 + \frac{R1}{R2} + \frac{R1}{R3} - \frac{1}{1 + \frac{R1}{R4} + \frac{R1}{R5}}\right]}{\left[\frac{1}{1 + \frac{R4}{R1} + \frac{R4}{R5} + \frac{R1}{R2}}\right]}$$

Equation 1 is taken in conjunction with the single figure and gives a voltage gain expression. In the equation the potentiometer resistance has been expressed as two resistances from the wiper tap to the two ends of the resistance element.

In the single figure, there is shown voltage in (Vi) at point 10 and voltage out (Vo) at point 20. Amplifier 19 receives V+ and V− voltage. At the positive input thereof there is shown resistor 18 (R8) connected to ground. From the output of amplifier 19, resistor 12 (R2) is connected in series with resistor 13 (R3) to ground. Linear potentiometer 21 is connected from the output of amplifier 19 to ground. Linear potentiometer 21 is shown as being comprised of resistors 14 (R4) and 15 (R5). Resistor 16 (R6) is connected from point 22 to the negative input of amplifier 19. The negative input of amplifier 19 is also connected to ground by way of resistor 17 (R7).

In the operation of the nonlinearly variable gain circuit, resistor 14 (R4) varies linearly from $R_{max}$ to zero with clockwise rotation and resistance 15 (R5) varies linearly from zero to $R_{max}$ at the same time. Total resistance remains constant as $R4+R5=R_{max}$, the total potentiometer resistance. Circuit gain at the center of rotation is set by resistors 12 (R2) and 13 (R3), while eccentricity is set by resistor 11 (R1). A total scale factor is introduced at all rotations by resistors 16 (R6) and 17 (R7). Circuit gain is positive (noninverting) and must lie in the region from $+1$ to $+\infty$. Maximum gain is practically limited to some finite value depending upon the desired bandwidth and choice of operational amplifier.

Use of the circuit is indicated where normal operation requires a very accurate gain setting about some nominal point but abnormal operation requires less accurate gain settings farther from the nominal point. Expressed as a derivative this means that the slope of the gain versus rotation curve (db/degree) should be small near the nominal point and become larger as gain is varied from the nominal point.

Alternate embodiments of the invention may use transistors instead of operational amplifier gain, or may use a different taper potentiometer to obtain modified inverted S curves.

What is claimed is:

1. A nonlinearly variable gain circuit comprising an operational amplifier having a positive and a negative input and a single output, said positive input receiving an input voltage, a preselected first resistor connected from said positive input to ground, second and third preselected resistors in series connected from said single output to ground, a fourth preselected resistor connected between said second and third resistor to said negative input to provide a feedback path for said operational amplifier, a fifth preselected resistor connected from said negative input to ground, a linear resistor taper potentiometer having a taper arm, the total resistance thereof being connected from the output of said operational amplifier to ground, and a sixth preselected resistor connected from between said second and third resistor to said taper arm so that the circuit produces an inverted logarithmic S curve of gain versus potentiometer rotation while using a linear resistance taper potentiometer.

* * * * *